United States Patent
Chang et al.

(10) Patent No.: US 7,893,494 B2
(45) Date of Patent: Feb. 22, 2011

(54) METHOD AND STRUCTURE FOR SOI BODY CONTACT FET WITH REDUCED PARASITIC CAPACITANCE

(75) Inventors: Leland Chang, New York, NY (US); Anthony I. Chou, Beacon, NY (US); Shreesh Narasimha, Beacon, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/141,276

(22) Filed: Jun. 18, 2008

(65) Prior Publication Data

US 2009/0315138 A1    Dec. 24, 2009

(51) Int. Cl.
 *H01L 27/12* (2006.01)
(52) U.S. Cl. ............... 257/347; 257/386; 257/E27.112; 438/479
(58) Field of Classification Search ........................ None
See application file for complete search history.

(56) References Cited

U.S. PATENT DOCUMENTS

| | | | |
|---|---|---|---|
| 6,919,606 B2 * | 7/2005 | Shino .......................... | 257/388 |
| 6,955,931 B1 | 10/2005 | Brown et al. | |
| 7,011,980 B1 | 3/2006 | Na et al. | |
| 7,084,462 B1 * | 8/2006 | Warnock et al. ............ | 257/348 |
| 7,135,742 B1 * | 11/2006 | Harada et al. ............... | 257/347 |
| 2002/0079544 A1 | 6/2002 | Shino | |
| 2003/0132464 A1 | 7/2003 | Yamaguchi et al. | |
| 2005/0127442 A1 * | 6/2005 | Veeraraghavan et al. .... | 257/347 |
| 2006/0033165 A1 * | 2/2006 | Chan et al. .................. | 257/368 |
| 2006/0175661 A1 | 8/2006 | Huang | |
| 2006/0249756 A1 * | 11/2006 | Matsumoto et al. ......... | 257/224 |
| 2008/0237708 A1 * | 10/2008 | Mandelman et al. ........ | 257/347 |

FOREIGN PATENT DOCUMENTS

| | | |
|---|---|---|
| JP | 2001-223360 | 8/2001 |
| JP | 2002-134755 | 5/2002 |
| JP | 2002-261292 | 9/2002 |
| JP | 2007-514316 | 5/2007 |

OTHER PUBLICATIONS

Extended European Search Report dated Feb. 19, 2009.
Japanese Office Action dated Sep. 30, 2009.

\* cited by examiner

*Primary Examiner*—Hoang-Quan T Ho
(74) *Attorney, Agent, or Firm*—Scully, Scott, Murphy & Presser

(57) ABSTRACT

In one embodiment, the present invention provides a semiconductor device that includes a substrate including a semiconducting layer positioned overlying an insulating layer the semiconducting layer including a semiconducting body and isolation regions present about a perimeter of the semiconducting body; a gate structure overlying the semiconducting layer of the substrate, the gate structure present on a first portion on an upper surface of the semiconducting body; and a silicide body contact that is in direct physical contact with a second portion of the semiconducting body that is separated from the first portion of the semiconducting body by a non-silicide semiconducting region.

20 Claims, 9 Drawing Sheets

METHOD AND STRUCTURE FOR SOI BODY CONTACT FET WITH REDUCED PARASITIC CAPACITANCE

FIELD OF INVENTION

The present invention relates to semiconductor-on-insulator (SOI) devices and methods for fabricating the same. More particularly, a body contact is provided to a semiconductor-on-insulator device that may result in reduced parasitic capacitance to the device.

BACKGROUND OF THE INVENTION

Silicon-on-insulator (SOI) technology has become an increasingly important technique utilized in the fabrication and production of semiconductor devices. SOI technology deals with the formation of transistors in a relatively thin monocrystalline semiconductor layer, which overlays an insulating layer. In other words, the active devices are formed in a thin semiconductor disposed on an insulator layer rather than in the bulk semiconductor of the device.

In a typical SOI transistor, the body is generally isolated from the silicon substrate and usually kept floating. This may result in problems for current-sensitive circuit applications, since the body typically retains charge from the previous time the transistor was utilized. The retained charge within the body interferes with subsequent use of the device. A variety of solutions have been proposed to address the problems associated with the SOI semiconductor device. For example, the use of a body contact in the SOI device addresses this problem, and also allows the threshold voltage to be changed so that standby power can be reduced for low-power applications. The body contact in the SOI device has conventionally been made by the use of a T-shaped or a H-shaped polysilicon structure on an active area, thereby creating three distinct regions including a source region, a drain region, and a body contact region.

The T-shaped or H-shaped polysilicon layer includes a polysilicon gate portion and a polysilicon dummy portion that produces high gate capacitance and typically results in poor performance.

SUMMARY OF THE INVENTION

In one aspect, a semiconductor device is provided that includes a substrate having a semiconductor layer present overlying an insulating layer, wherein a silicide body contact reduces floating gate effects with an enhancement in parasitic capacitance and gate leakage that is not provided in prior semiconductor structures.

Broadly, a semiconductor device is provided that includes:

a substrate including a semiconducting layer positioned overlying an insulating layer, the semiconducting layer including a semiconducting body having a first portion and a second portion;

isolation regions present about a perimeter of the semiconducting body;

a gate structure overlying an upper surface of the first portion of the semiconducting body; and a silicide body contact that is in direct physical contact with the second portion of the semiconducting body, said silicide body contact is separated from the first portion of the semiconducting body by a non-silicide semiconducting region.

In another aspect, a method is provided for forming the above-described semiconductor device. Broadly, the method includes the steps of:

providing a substrate comprising a semiconducting layer positioned overlying an insulating layer, the semiconducting layer including a semiconducting body and isolation regions present about a perimeter of the semiconducting body;

forming a gate structure overlying a portion of the semiconducting body;

forming a dielectric spacer abutting the gate structure and atop a portion of the semiconducting body, wherein a remaining portion of the semiconducting body is exposed;

forming a silicide on the remaining portion of the semiconducting body; and removing a portion of the dielectric spacer that is adjacent to the silicide to expose a portion of the upper surface of the semiconducting body between the gate structure and the silicide.

In another example, the method of forming a semiconductor device includes:

providing a substrate comprising a semiconducting layer positioned overlying an insulating layer, the semiconducting layer comprising a semiconducting body and isolation regions present about a perimeter of the semiconducting body;

forming a gate structure overlying a portion of the semiconducting body;

forming dielectric layer overlying the gate structure and atop a portion of the upper surface of the semiconducting body adjacent to the portion of the upper surface of the semiconducting body underlying the gate structure;

removing a portion of the dielectric layer, wherein a remaining portion of the dielectric layer is positioned on a sidewall of the gate structure; and forming a silicide on the semiconductor body adjacent the remaining portion of the dielectric layer.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE DRAWINGS

Figure 1A:
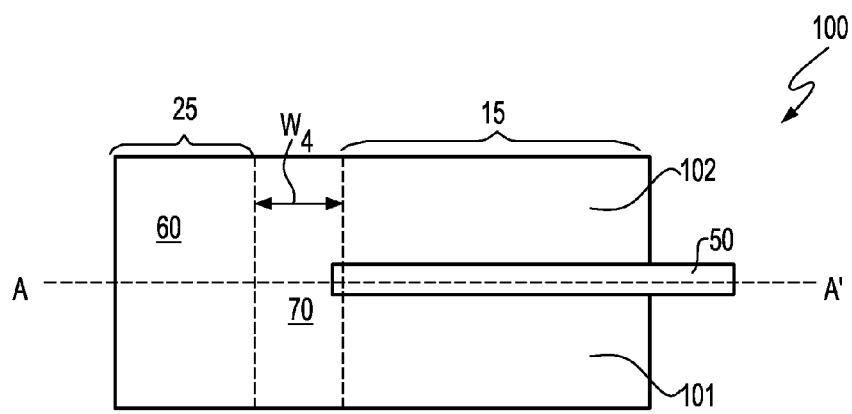
FIG. 1A is a top planar view of one embodiment of a semiconductor device, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods and structures relating to body contacts to semiconducting devices, in which the inventive body contact reduces parasitic resistance and gate leakage. When describing the following structures and methods, the following terms have the following meanings, unless otherwise indicated.

As used herein, "semiconducting body" refers to an intrinsic semiconductor material that has been doped, that is, into which a dopant has been introduced, giving it different electrical properties than the intrinsic semiconductor material. Doping involves adding dopant atoms to an intrinsic semiconductor, which changes the electron carrier concentration and hole carrier concentration of the intrinsic semiconductor. Dominant carrier concentrations in an extrinsic semiconductor classify it as either a p-type or n-type semiconductor.

As used herein, a "P-type" refers to the addition of trivalent impurities that create deficiencies of valence electrons to an intrinsic semiconductor, such as boron, aluminum or gallium to an intrinsic Si substrate.

As used herein, an "N-type" refers to the addition of pentavalent impurities that contribute free electrons to an intrinsic semiconductor substrate, such as antimony, arsenic or phosphorous dopants to an intrinsic Si substrate.

As used herein, "dopant region" refers to portions of the semiconducting body in which the electrical conductivity of the material is dependent upon n-type or p-type dopants.

A "body contact" is a conductive structure to the semiconductor body and not present overlying the source and drain regions of the device. The body contact is electrically contacted.

As used herein, the term "drain" means a doped region in semiconductor substrates located at the end of the channel in field effect transistors, in which carriers are flowing out of the transistor through the drain.

As used herein, the term "source" is a doped region from which majority carriers are flowing into the channel.

As used herein, the term "channel" is the region between the source and drain of a metal oxide semiconductor transistor that becomes conductive when the transistor is turned on.

A "gate structure" means a structure used to control output current (i.e., flow of carriers in the channel) of a semiconducting device, such as a field effect transistor (FET).

As used herein, a "gate dielectric" is a layer of an insulator between the semiconductor device substrate and the gate conductor.

As used herein, a "metal" is an electrically conductive material, wherein metal atoms are held together by the force of a metallic bond, and the energy band structure of metal's conduction and valence bands overlap, and hence, there is no energy.

As used herein, the "insulating" and/or "dielectric" denote a material having a room temperature conductivity of less than about $10^{-10}$ $(\Omega\text{-m})^{-1}$.

The term "anisotropic etch" denotes a material removal process in which the etch rate in the direction normal to the surface to be etched is greater than in the direction parallel to the surface to be etched.

"Electrically conductive" and/or "electrically communicating" as used through the present disclosure means a material having a room temperature conductivity of greater than $10^{-8}$ $(\Omega\text{-m})^{-1}$.

For purposes of the description hereinafter, the terms "upper", "lower", "right", "left", "vertical", "horizontal", "top", "bottom", and derivatives thereof shall relate to the invention, as it is oriented in the drawing figures. Further, it will be understood that when an element as a layer, region or substrate is referred to as being "atop" or "over" or "overlying" or "below" or "underlying" another element, it can be directly on the other element or intervening elements may also be present. In contrast, when an element is referred to as being "directly on" or "directly over" of in "direct physical contact" with another element, there are no intervening elements present.

References in the specification to "one embodiment", "an embodiment", "an example", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1B:
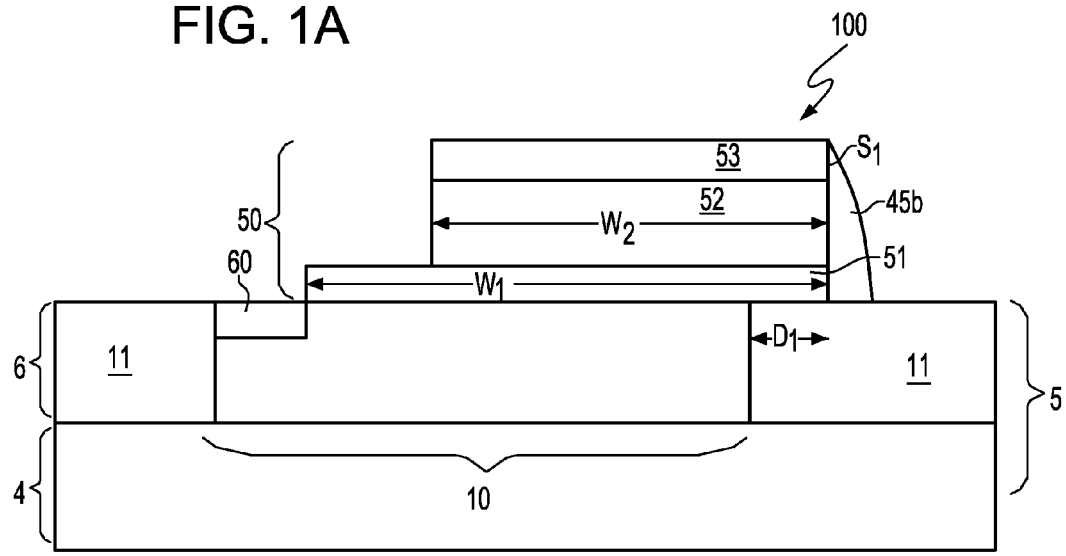
FIG. 1B is a side cross-sectional view of the structure depicted in FIG. 1A along section line A-A, in accordance with the present invention.

FIGS. 1A and 1B depict one embodiment of a semiconductor device 100, in accordance with the present invention. The semiconductor device 100 may include a substrate 5 including a semiconducting layer 6 positioned overlying an insulating layer 4. The semiconducting layer 6 as shown, includes a semiconducting body 10. Isolation regions 11, are also shown about a perimeter of the semiconducting body 10. That is, the isolation regions 11 are laterally abutting the semiconducting body 10. The inventive structure may also include a gate structure 50 overlying the semiconducting layer 6 of the substrate 5. The gate structure 50 may be present on a first portion 15 of an upper surface of the semiconducting body 10, and a silicide body contact 60 that is in direct physical contact with a second portion 25 of the semiconducting body 10 that is separated from the first portion 15 of the semiconducting body 10 by a non-silicide semiconducting region 70.

The substrate 5 may be a semiconductor-on-insulator substrate, as depicted in FIG. 1B. The gate structure 50 that is present on the upper surface of the semiconducting body 10 may include a gate dielectric 51 that is present on a portion of the upper surface of the semiconducting body 10 and a gate conductor 52 present overlying the gate dielectric 51. A gate contact silicide 53 may be present atop the gate conductor 52.

The gate structure 50 may include a portion that extends onto a surface of an isolation region 11 that is opposite a portion of the gate structure 50 that is in closest proximity to the silicide body contact 60. The portion of the gate structure 50 that overlies the isolation region 11 may have a dimension D1 ranging from about 5 nm to about 30 nm. In one embodiment, the portion of the gate structure 50 that overlies the isolation region 11 includes a substantially co-planar sidewall S1. The term "co-planar" as used to describe the substantially co-planar vertical sidewall S1 means that the sidewall of the gate dielectric 51 is aligned to the sidewall of the gate conductor 52 to provide a planar surface. The gate dielectric 51 typically has a first width $W_1$ and the gate conductor 52 has a second width $W_2$, wherein the first width $W_1$ is greater than the second width $W_2$.

A dielectric spacer 45b may be present abutting the sidewall S1 of the gate structure 50 opposite the portion of the gate structure 50 that is in closest proximity to the silicide body contact 60.

The silicide body contact 60 may be present on the upper surface of a second portion 25 of the semiconductor body 10 and extends to a depth of the semiconductor body 10 that is consumed during the silicidation process that provides the silicide body contact 60. The silicide body contact 60 may be positioned on a portion of the semiconductor body 10 that is adjacent to source 101, drain 102, and channel regions of the semiconducting body 10. The silicide body contact 60 may be composed $NiSi_2$, $TiSi_2$, $CoSi_2$, $MoSi_2$, $PtSi_2$, $TaSi_2$, $WSi$ or a combination thereof.

The non-silicide semiconducting region 70 that separates the first portion 15 of the semiconducting body 10 from the second portion 25 of the semiconducting body 10 can be a p-type semiconductor region. The non-silicide semiconducting region 70 may have a width $W_4$ ranging from about 5 nm to about 100 nm. In one embodiment, the non-silicide semiconducting region 70 has a width $W_4$ ranging from about 10 nm to about 50 nm. In an even further embodiment, the non-silicide semiconducting region 70 has a width $W_4$ ranging from about 10 nm to about 20 nm.

Figure 2A:
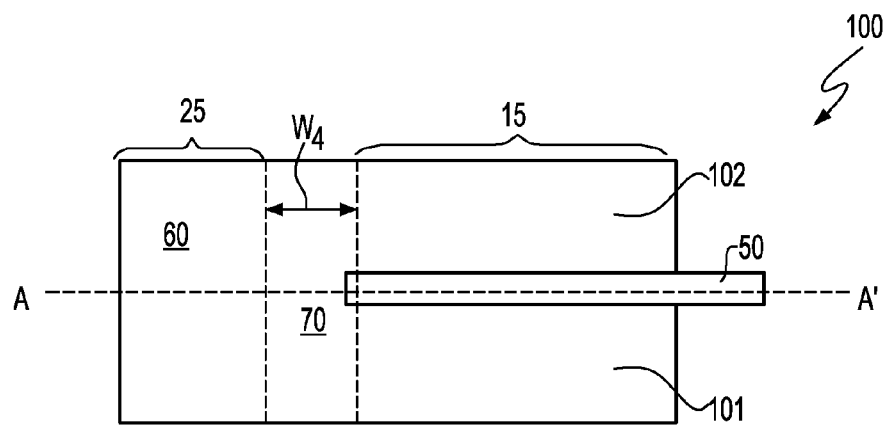
FIG. 2A is a top planar view of another embodiment of a semiconductor device, in accordance with the present invention.
Figure 2B:
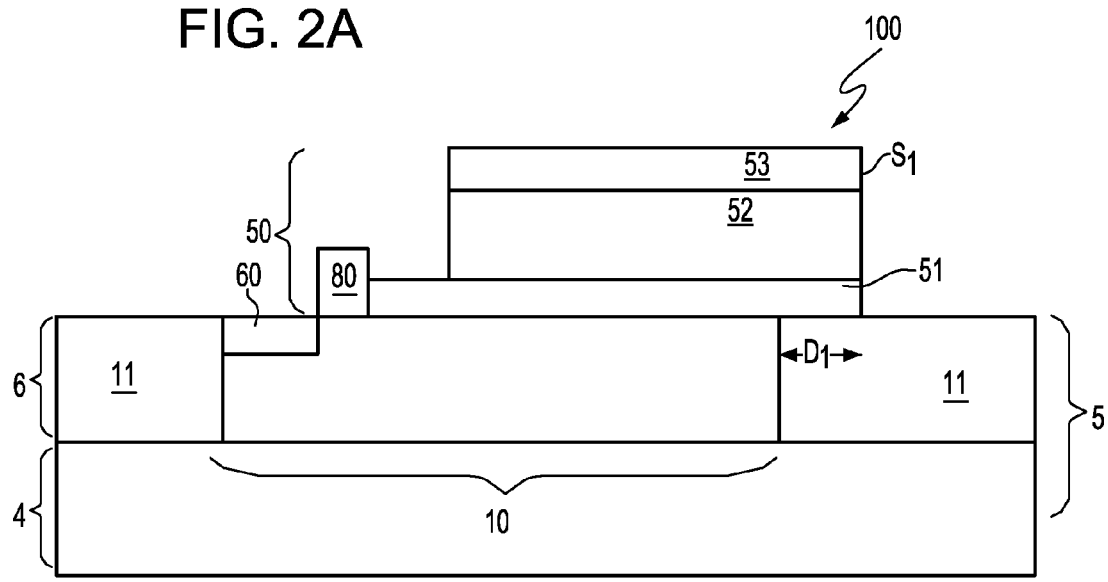
FIG. 2B is a side cross-sectional view of the structure depicted in FIG. 2A along section line A-A, in accordance with the present invention.

FIGS. 2A and 2B depict an embodiment of the inventive semiconducting device, in which a dielectric spacer 80 is present atop the non-silicide semiconducting region 70.

The various components of the structure shown in FIGS. 1A-1B, as well as one embodiments of a method that can be used in forming the same will now be described in greater detail referring to FIGS. 3A-10B.

FIGS. 3A-5B depict one method for forming a semiconductor device similar to the semiconducting device 100 that is depicted in FIGS. 1A-1B. The method of forming a semiconducting device may begin with providing a substrate 5 including a semiconducting layer 6 positioned overlying an insulating layer 4, the semiconducting layer 6 including a semiconducting body 10. Isolation regions 11 are present about a perimeter of the semiconducting body 10. In a following process step, a gate structure 50 is formed overlying a portion 10 of the semiconducting body 10. The gate structure 50 may include a gate dielectric 51 present on an upper surface of the portion of the semiconducting body 10 and a gate conductor 52 present overlying the gate dielectric 51. Thereafter, dielectric spacers 45a, 45b are formed abutting the gate structure 50 and atop the semiconducting body 10, wherein a remaining portion of the semiconducting body 10 is exposed. In a following process step, a silicide body contact 60 is formed on the remaining portion of the semiconducting body 10. Thereafter, a portion of the dielectric spacer 45a is removed that is adjacent to the silicide body contact 60 to expose a portion of the upper surface of the semiconducting body 10 between the gate structure 50 and the silicide body contact 60.

Figure 3A:
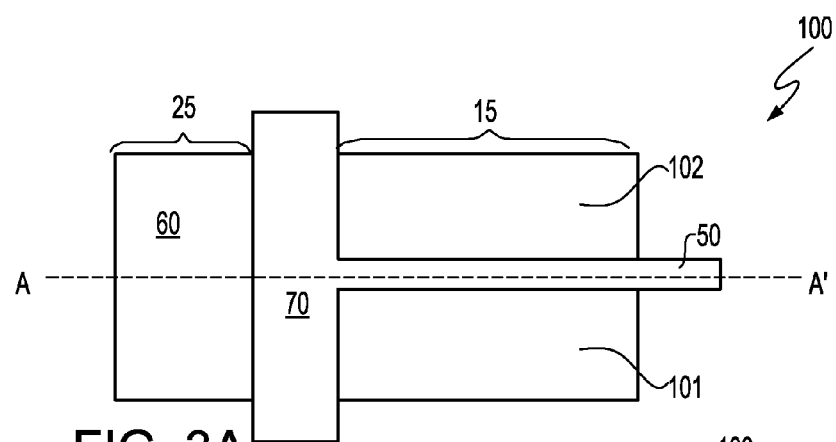
FIG. 3A is a top planar view of an initial structure including a gate structure atop a semiconductor-silicon-on-insulator substrate, as used in accordance with the present invention.
Figure 3B:
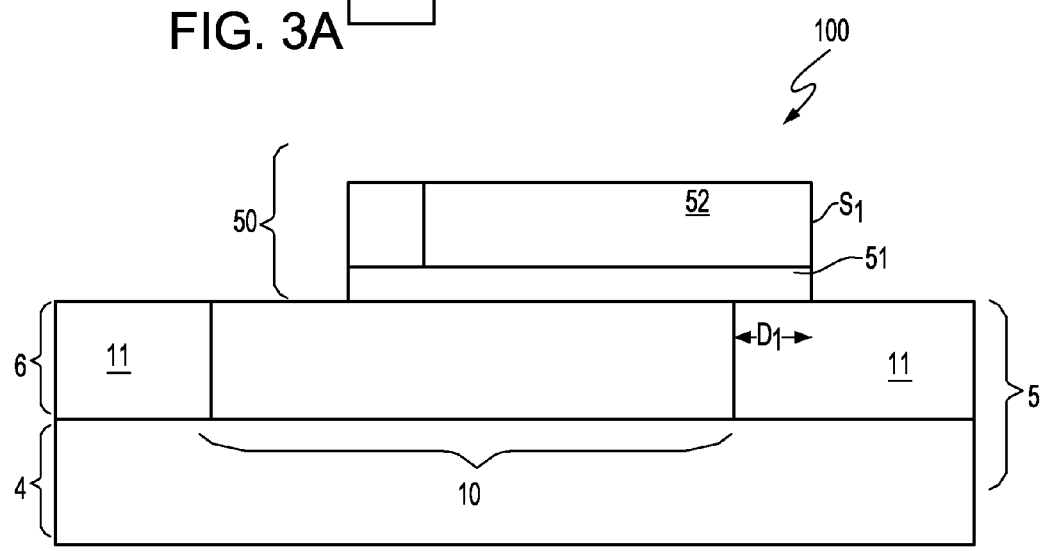
FIG. 3B is a side cross-sectional view of the structure depicted in FIG. 3A along section line A-A, in accordance with the present invention.

Referring to FIGS. 3A and 3B, one example of an initial structure is depicted including a gate structure 50 atop a substrate 5. The substrate 5 may include a semiconducting layer 6 atop an insulating layer 4. The substrate 5 may be a silicon-on-insulator substrate, wherein an upper Si-containing layer of the SOI substrate provides the semiconducting layer 6 and the buried insulator layer of the SOI substrate provides the insulating layer 4. The substrate 5 is hereafter referred to as an SOI substrate 5; the semiconducting layer 6 is hereafter referred to as the upper Si-containing layer 6; and insulating layer 4 is hereafter referred to as the buried insulating layer 4.

In one embodiment, the SOI substrate 5 includes a bottom Si-containing layer (not shown), a buried insulating layer 4, such as an oxide or nitride, located on an upper surface of the bottom Si-containing layer, and an upper Si-containing layer 6 (also referred to as an SOI layer 6), located on the buried insulating layer 4. The term "Si-containing layer" denotes any material that includes silicon. Illustrative examples of Si-containing materials include, but are not limited to: Si, SiGe, SiGeC, SiC, polysilicon, i.e., polySi, epitaxial silicon, i.e., epi Si, amorphous silicon, i.e., a:Si, and multilayers thereof.

The upper Si-containing layer 6 of the substrate 5 may be a doped layer, which may contain an n-type or p-type dopant. Doping can be introduced into the SOI layer 6 prior to, or after the formation of the SOI substrate 5. The dopant concentration within the upper Si-containing layer 6 may range from about 1 E 17 atoms/cm$^3$ to about 1 E 19 atoms/cm$^3$. In one embodiment, the first portion 15 of the SOI layer 6 is doped with an n-type dopant, i.e. n$^+$ dopant, wherein the first portion 15 of the SOI layer 6 contains the source 101 and drain regions 102 of the device. Another embodiment, the second portion 25 of the SOI layer 6 is doped with a p-type dopant, i.e., p+ dopant, wherein the second portion 25 of the upper Si-containing layer 6 contains the subsequently formed silicide body contact 60 to the device. In a further embodiment, the portion of the upper Si-containing layer 6 that is subsequently processed to provide the non-silicide semiconducting region is doped with a p-type dopant, i.e., p+ dopant.

The upper Si-containing layer 6 of the SOI substrate 5 may have a thickness ranging from about 10 nm to about 1000 nm. In another embodiment, the upper Si-containing layer 6 of the SOI substrate 5 has a thickness ranging from about 50 nm to about 500 nm. The thickness of the buried insulating layer 4 may range from about 100 to about 1000 nm. In another embodiment, the buried insulating layer 4 has a thickness that ranges from about 120 nm to about 200 nm.

The SOI substrate 5 can be formed using a layer transfer process or a bonding process. In another embodiment, a technique referred to as separation by implanted oxygen (SIMOX) wherein ions, typically oxygen or nitrogen, are implanted into a bulk Si-containing substrate and then the substrate containing the implanted ions is annealed under conditions that are capable of forming a buried insulating layer 4 can be employed.

After providing the substrate 5, a pad oxide layer (not shown) is typically formed on an upper exposed surface of the SOI substrate 5 by a thermal oxidation process. The pad oxide layer may also be formed by a deposition process, such as chemical vapor deposition (CVD), plasma-assisted chemical vapor deposition, evaporation or solution deposition. The pad oxide layer formed at this point of the present invention typically has a thickness ranging from about 5 nm to about 20 nm. Embodiments of the present invention have been contemplated in which the pad oxide layer is omitted.

In a following process step, isolation regions 11 may be formed into the SOI substrate 5 by forming a hardmask (not shown) on the surface of the pad oxide layer and then utilizing lithography and etching. The lithographic step employed in the present invention may include applying a photoresist (not shown) to the hardmask material layer; exposing the photoresist to a pattern of radiation (in the present case a trench pattern is employed); and developing the pattern into the photoresist utilizing a conventional resist developer. The etching step, which may be used to transfer the trench pattern first into the hardmask and then into the pad oxide layer and the SOI substrate 5, includes any dry etching process, such as reactive-ion etching, ion beam etching, plasma etching, laser ablation or any combination thereof. In one embodiment, a single etching process may be employed, or in another embodiment, more than one etching process may be employed to form trenches in the SOI substrate 5. After the pattern has been transferred into the hardmask, the photoresist is typically removed from the structure and then pattern transfer continues using the hardmask as an etch mask. In one embodiment, the depth of the trenches formed may stop within the SOI layer 6 of the SOI substrate 5, or in another embodiment, the depth of the trenches may extend down to the buried insulating layer 4.

After trenches have been formed in the SOI substrate 5, the trenches are filled with a trench dielectric material such as high-density plasma (HDP) oxide or TEOS (tetraethylorthosilicate) using a deposition processes. The filled trenches form isolation regions 11 in the structure that serve to isolate various device regions from each other. In some embodiments of the present invention, the walls of the trenches are lined with a liner material, such as $SiO_2$ or $Si_3N_4$, prior to filling with the trench fill material. After the filling process, a planarization process and/or densification may be performed on the structure. The planarization process can be stopped on the hardmask and thereafter the hardmask may then be removed by utilizing an etching process that selectively removes the hardmask material from the structure. In the embodiments of the present invention, in which the pad oxide layer is present, the pad oxide layer may be removed from the surface of substrate 5 using a stripping process that is highly selective in removing oxide.

Still referring to FIGS. 3A and 3B, the gate structures 50 may formed using deposition, photolithography and selective etching processes. The gate structures 50 include a gate conductor 52 atop a gate dielectric 51. In one embodiment, the gate conductor 52 material is polysilicon. In another embodiment, the gate conductor 52 may also be composed of elemental metals, metal alloys, metal silicides, or other conductive materials. The gate conductor 52 layer may be formed using chemical vapor deposition, such as plasma enhanced chemical vapor deposition, or physical vapor deposition, such as plating or sputtering. The gate conductor 52 layer may have a thickness ranging from about 10 nm to about 100 nm.

The gate dielectric 51 may be a low-k dielectric material (having a dielectric constant equal to or less than 4.0) such as $SiO_2$ or SiON or a high-k dielectric (having a dielectric constant greater than about 4.0), such as oxides of Ta, Zr, Al or combinations thereof. Hf containing high-k dielectrics are also contemplated and are within the scope of the present invention. The thickness of the gate dielectric layer 51 is typically from about 1 nm to about 10 nm. More typically, the gate dielectric 51 has a thickness of from about 1.5 to about 2.5 nm. The gate dielectric 51 may be formed using a deposition method, such as chemical vapor deposition. The gate dielectric layer 8 may also be formed using a thermal growth method, such as thermal oxidation.

The gate structure 50 can be formed from the material layers of the gate dielectric 51 and the gate conductor 52 using photolithography and etch processing steps. For example, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected, while the exposed regions are removed using a selective etching process that removes the unprotected regions.

Figure 4A:
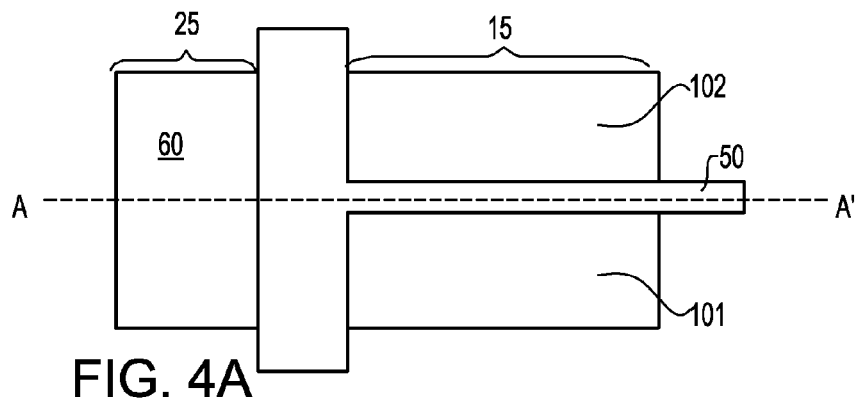
FIG. 4A is a top planar view depicting forming a dielectric spacer abutting the gate structure, forming a silicide body contact, and forming a photoresist mask (shown in FIG. 4B), in accordance with the present invention.
Figure 4B:
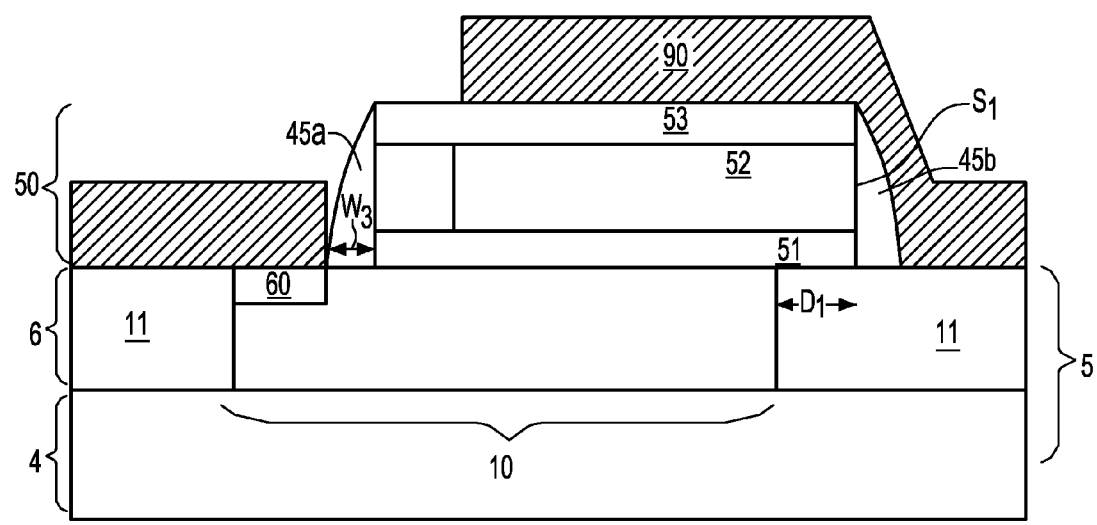
FIG. 4B is a side cross-sectional view along section line A-A of FIG. 4A that depicts forming a photoresist mask atop the initial structure following the formation of the silicide body contact, in accordance with the present invention.

FIGS. 4A and 4B depict the formation of a dielectric spacer 45a, 45b adjacent the sidewalls $S_1$, $S_2$ of the gate structure 50 in accordance with one embodiment of the present invention. The dielectric spacer 45a, 45b may be composed of an oxide, nitride or oxynitride material. The dielectric spacer 45a, 45b is typically composed of silicon nitride and is formed in direct physical contact with the sidewalls of the gate conductor 52. The dielectric spacer 45a, 45b may be formed using deposition and etch processes, and may have a width $W_3$ ranging from about 2 nm to about 70 nm. In another embodiment, the dielectric spacer 45a, 45b may be formed using deposition and etch processes, and may have a width $W_3$ ranging from about 6 nm to about 30 nm. The thickness of the dielectric spacer 45a, 45b may be selected to dictate the dimension of separation between the subsequently formed silicide body contact 60 and the gate structure 50.

A thin spacer (not shown) may be formed on the sidewall of the gate structure 50 prior to the formation of the dielectric spacer 45a, 45b. In one embodiment, in which the dielectric spacer 45a, 45b is composed of silicon nitride, a thin spacer composed of an oxide may be formed using a conformal deposition process on the sidewall of the gate structure 50 prior to the formation of the dielectric spacer 45a, 45b. The thin spacer may be formed using thermal oxidation and may have a thickness ranging from about 1 nm to about 5 nm.

In a following process step, a silicide that provides the silicide body contact 60 is formed on the portion of the upper surface of the semiconductor body 10 that is not covered by the spacer 45a, 45b or the gate structure 50. Silicide formation typically includes depositing a metal layer, such as a refractory metal, onto the surface of a Si-containing material. The metal layer may be deposited using physical vapor deposition (PVD), such as plating or sputtering, or may be deposited using chemical vapor deposition (CVD). The metal layer may be composed of Ni, Ti, Co, Mo, Pt, Ta, W or a combination thereof. Following deposition, the structure is then subjected to an annealing step using conventional processes such as, but not limited to, rapid thermal annealing. During thermal annealing, the deposited metal reacts with Si forming a metal semiconductor alloy, which is also referred to as a metal silicide. In one embodiment, the silicide, i.e., silicide body contact 60, is composed $NiSi_2$, $TiSi_2$, $CoSi_2$, $MoSi_2$, $PtSi_2$, $TaSi_2$, WSi or a combination thereof. A gate contact silicide 53 may also be formed atop the gate conductor 52. Following thermal anneal, the unreacted portions of the metal layer may be removed with a selective etch process.

FIGS. 4A and 4B also depict one embodiment of forming an photoresist mask 90 for removing a portion of the dielectric spacer 45a, 45b that is adjacent the silicide body contact 60 to expose the upper surface of the semiconductor body 10 that is present between the gate structure 50 and the silicide body contact 60. The step of removing a portion of the dielectric spacer 45a, 45b may include forming a photoresist mask 90 overlying the gate structure 50 and exposing the portion of the dielectric spacer 45a, 45b that is to be removed in order to expose the upper surface of the semiconductor body 10 between the gate structure 50 and the silicide body contact 60.

It is noted that the portion of the upper surface of the semiconductor body 10 that is exposed during this process step corresponds to the non-silicide semiconducting region 70 that separates the first portion 15 of the semiconducting body 10 from the second portion 25 of the semiconducting body 10. The photomask 90 may also expose a portion of the gate structure 50. In one embodiment, the exposed portion of the gate structure 50 has a length ranging from about 2 nm to about 60 nm, as measured from the sidewall of the gate structure 50 that is adjacent to the portion 45b of the dielectric spacer 45a, 45b that is exposed by the photoresist mask 90. In another embodiment, the exposed portion of the gate structure 50 has a length ranging from about 5 nm to about 20 nm, as measured from the sidewall of the gate structure 50 that is adjacent to the portion 45b of the dielectric spacer 45a, 45b that is exposed by the photoresist mask 90.

A process sequence for producing the photoresist mask 90 may begin with depositing a layer of photoresist material atop the surface to be etched via spin coating or similar processes. The photoresist material may be composed of dielectrics including carbon, oxygen, and various inorganic materials. Following application of the photoresist layer, the photoresist is soft-baked, where the solvents of the photoresist layer are evaporated via heating.

In a following process step, the layer of photoresist is then patterned utilizing photolithography and development process steps to provide patterned photoresist mask 90. Specifically, a pattern may be formed using a reticle or photomask and transferred into the surface of the layer of the photoresist. First, the pattern on the reticle or photomask is transferred onto a layer of photoresist on the surface to be etched, wherein light is passed through the opaque pattern of the reticle, which in turn produces a patterned image on the layer of photoresist.

The photoresist layer is a light or radiation sensitive material and exposure to light causes changes in the photoresist structure. For example, exposure to light may change the exposed portions of the photoresist from a soluble condition to an insoluble one.

Following exposure the pattern is developed utilizing a resist developer, such as a chemical solvent. The developer leaves a hole in the resist layer that corresponds to the opaque pattern of the reticle. An alternative resist strategy, commonly referred to as a negative resist, leaves a pattern in the resist opposite to that on the mask. Development of the pattern is conducted using development techniques including, but not limited to: continuous spray development and puddle development. Following development, the portion of the dielectric spacer 45a adjacent the silicide body contact 60 is exposed, wherein the remaining portion of the photoresist layer is present overlying the silicide body contact 60 and at least a portion of the gate structure 50.

Figure 5A:
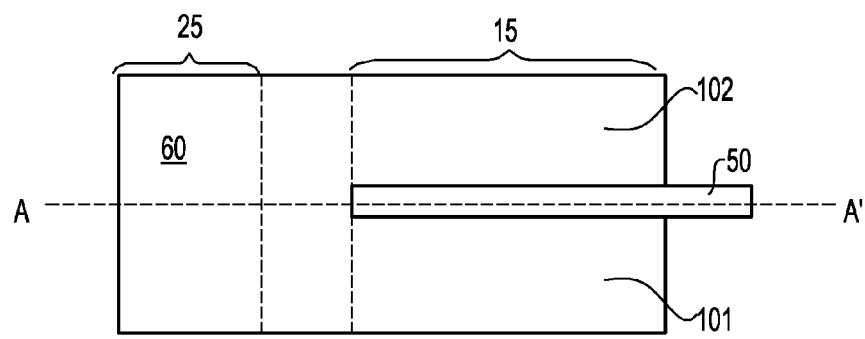
FIG. 5A is a top planar view of the structure depicted in FIG. 4A following an etch step to remove a portion of the gate structure using the photoresist mask as an etch mask, in accordance with the present invention.
Figure 5B:
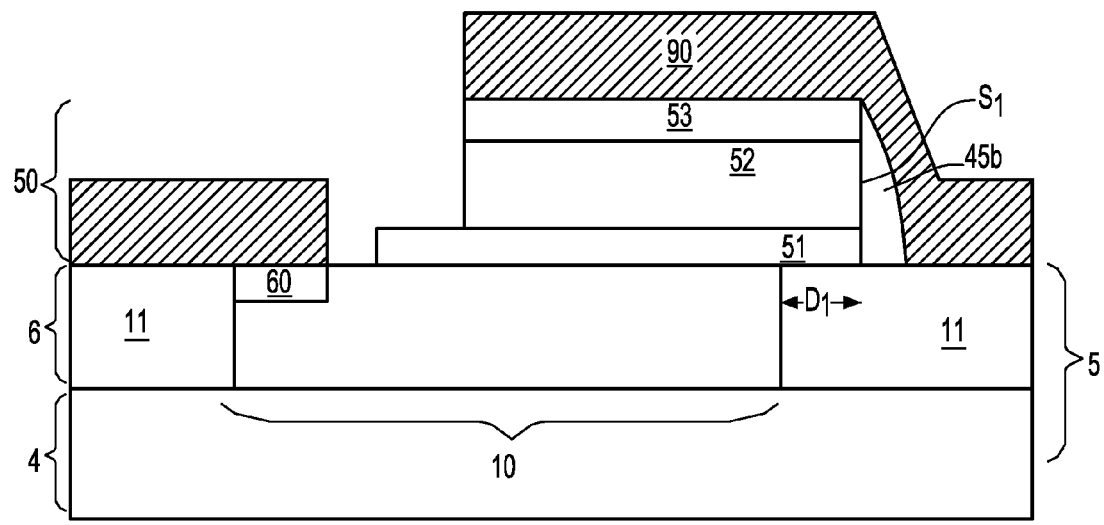
FIG. 5B is a side cross-sectional view of the structure depicted in FIG. 5A along section line A-A, in accordance with the present invention.

FIGS. 5A and 5B depict an etch step to remove a portion 45a of the dielectric spacer 45a, 45b that is adjacent the silicide body contact 60 and expose the upper surface of the semiconductor body 10 that corresponds to the non-silicide semiconducting region 70, which separates the silicide body contact 60 from the gate structure 50. The etch process may be a selective etch. As used herein, the term "selective" in reference to a material removal process denotes that the rate of material removal for a first material is greater than the rate of removal for at least another material of the structure to which the material removal process is being applied. In one embodiment, in which the silicide gate contact 53 is present, the etch step removes the exposed portion of the dielectric spacer 45a selective to the photoresist etch mask 90, the silicide gate contact 51 and the semiconducting body 10. When the dielectric spacer 45a is composed of silicon nitride, the etch chemistry of the selective etch process may include a wet hot phosphoric acid or a reactive ion etch using an etch chemistry that may include $CH_3$, $CH_4$, or $NF_3$. In a following process, a selective etch step is conducted to remove the exposed portion of the silicide gate contact 53 and the portion of the gate conductor 52 underlying the exposed portion of the silicide gate contact 53 selective to the photoresist mask 90, the gate dielectric 51 and the semiconductor body 10. When the silicide gate contact 53 is composed of $NiSi_2$, and the gate conductor 52 is composed of silicon, the gate dielectric 51 is composed of $SiO_2$, the selective etch chemistry may be composed of $HBr/O_2$.

The etch process may be an anisotropic etch process, such as reactive ion etch (RIE). Reactive ion etching is a form of plasma etching, in which during etching the surface to be etched is placed on an RF powered electrode, wherein the surface to be etched takes on a potential that accelerates the etching species that is extracted from a plasma towards the surface to be etched, in which a chemical etching reaction is taking place in the direction normal to the surface. In a following process step, the photoresist mask 90 may be removed using a stripping process, such as oxygen ashing to provide the final structure depicted in FIGS. 1A and 1B.

FIGS. 6A-9B depict one embodiment of method for forming a semiconductor device 100 similar to the semiconducting device depicted in FIGS. 2A-2B. The method of forming a semiconducting device may begin with providing a substrate 5 including a semiconducting layer 6 positioned overlying an insulating layer 4. The semiconducting layer 6 of the substrate may include a semiconducting body 10. Isolation regions 11 are present about a perimeter of the semiconducting body 10. Thereafter, a gate structure 50 may be formed overlying a portion of the semiconducting body 10. The gate structure 50 may include a gate dielectric 51 present on an upper surface of the portion of the semiconducting body 10 and a gate conductor 52 present overlying the gate dielectric 51. In a following step, a dielectric layer 55 may be formed overlying the gate structure 50 and atop a portion of the upper surface of the semiconducting body 10 adjacent to the portion of the upper surface of the semiconducting body 10 underlying the gate structure 50. A portion of the dielectric layer 55 may then be removed, wherein a remaining portion 56 of the dielectric layer 55 is positioned on a sidewall $S_2$ of the gate structure 50. Thereafter, a silicide body contact 60 can be formed on the semiconductor body 10 adjacent the remaining portion 56 of the dielectric layer 55.

The step of removing a portion of the dielectric layer 55 may include forming a photoresist etch mask 95 that exposes the portion of the dielectric layer 55 that is to be removed and etching the exposed portion of the dielectric layer, wherein the portion of the dielectric layer 55 underlying the etch mask 95 is protected to provide the remaining portion 56 of the dielectric layer that is positioned on the sidewall $S_2$ of the gate structure 50.

Figure 6A:
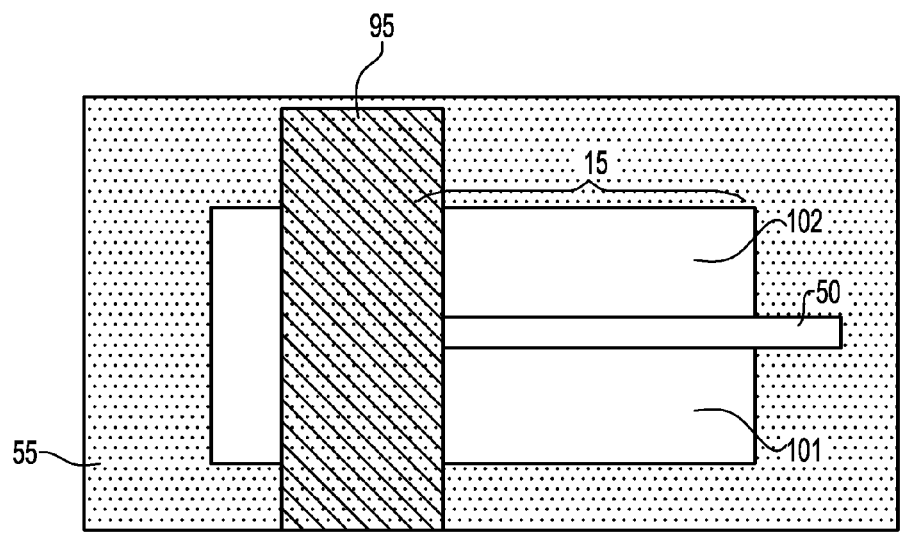
FIG. 6A is a top planar view of a second embodiment of the present invention, in which a dielectric layer is formed atop the structure depicted in FIG. 3A, followed by the formation of a photoresist mask, in accordance with the present invention.
Figure 6B:
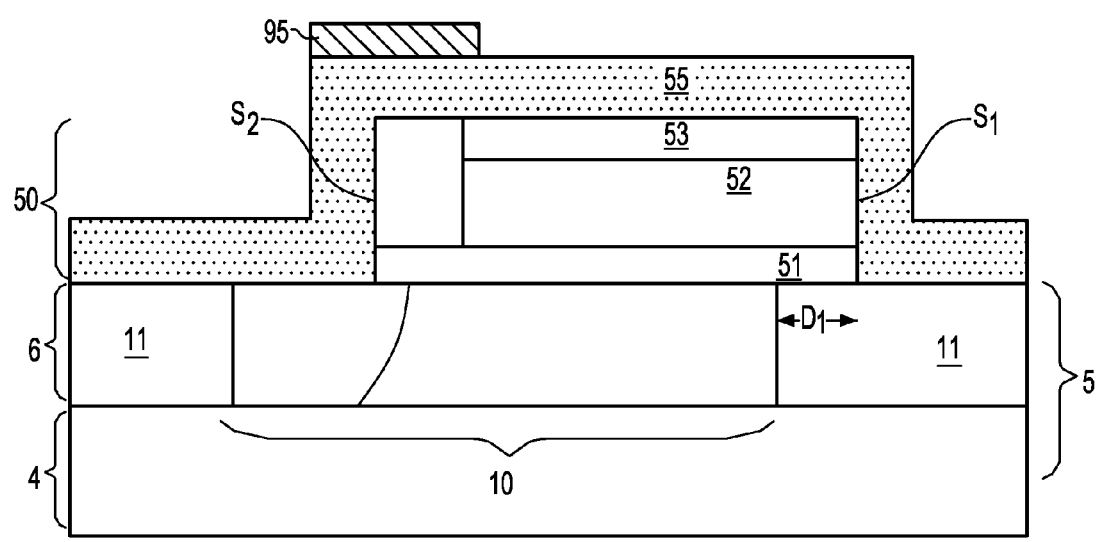
FIG. 6B is a side cross-sectional view of the structure depicted in FIG. 6A along section line A-A, in accordance with the present invention.

FIGS. 6A and 6B depict forming a dielectric layer 55 atop the structure depicted in FIG. 3A followed by the formation of a photoresist mask 95. It is noted that the above description corresponding to FIG. 3A is applicable to the present embodiment of the invention.

The dielectric layer 55 may be composed of an oxide, a nitride or an oxynitride. The dielectric layer 55 can be a stress-inducing material. In one example, the dielectric layer 55 is composed of silicon nitride. The dielectric layer 55 may be formed using chemical vapor deposition, such as plasma enhanced chemical vapor deposition, or thermal growth. In one embodiment, the dielectric layer 55 has a thickness ranging from about 10 nm to about 100 nm. In another embodiment, the dielectric layer 55 has a thickness ranging from about 30 nm to about 60 nm.

The photoresist mask 95 may be formed utilizing photolithography and development process steps. A pattern is produced by applying a photoresist layer to the surface to be etched; exposing the photoresist layer to a pattern of radiation; and then developing the pattern into the photoresist layer utilizing resist developer. Once the patterning of the photoresist layer is completed, the sections covered by the photoresist layer are protected, while the exposed regions of the dielectric layer 55 are removed.

Figure 7A:
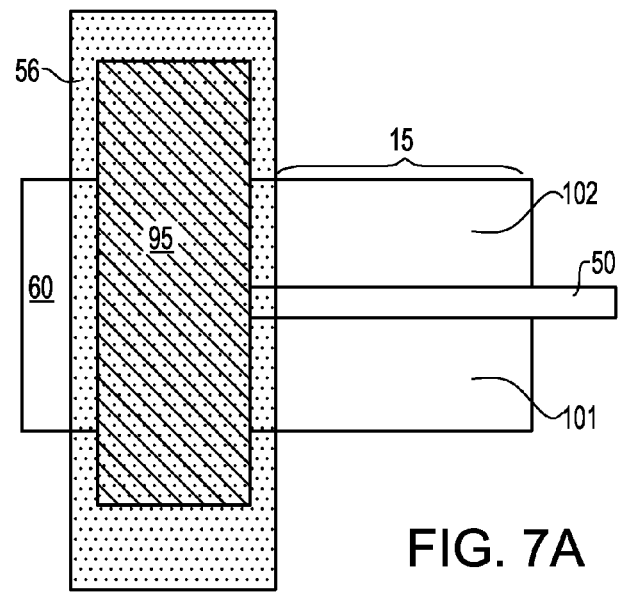
FIG. 7A is a top planar view depicting etching the dielectric layer to provide a hard mask, in accordance with the present invention.
Figure 7B:
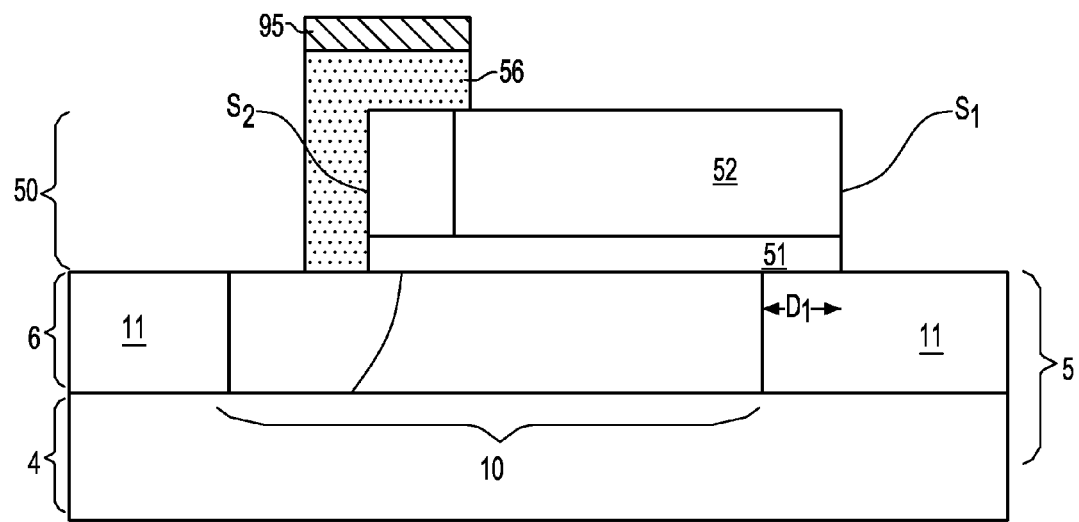
FIG. 7B is a side cross-sectional view of the structure depicted in FIG. 7A along section line A-A, in accordance with the present invention.

FIGS. 7A and 7B depict etching the dielectric layer 55 to provide a hard mask. The etch step to remove the portions of the dielectric layer 55 that are exposed by the photoresist mask 95, may be a selective etch step that removes the exposed portion of the dielectric layer 55 selective to the photoresist mask 95, the gate conductor 52 and the semiconducting body 10. When the dielectric layer 55 is composed of silicon nitride, the etch chemistry of the selective etch process may include wet hot phosphoric acid or a reactive ion etch using an etch chemistry that may include $CH_3$, $CH_4$, or $NF_3$. The etch process can be an anisotropic etch process, which may include reactive ion etch (RIE). In a following process, the photoresist mask 95 is removed using a stripping process, such as oxygen ashing.

Figure 8A:
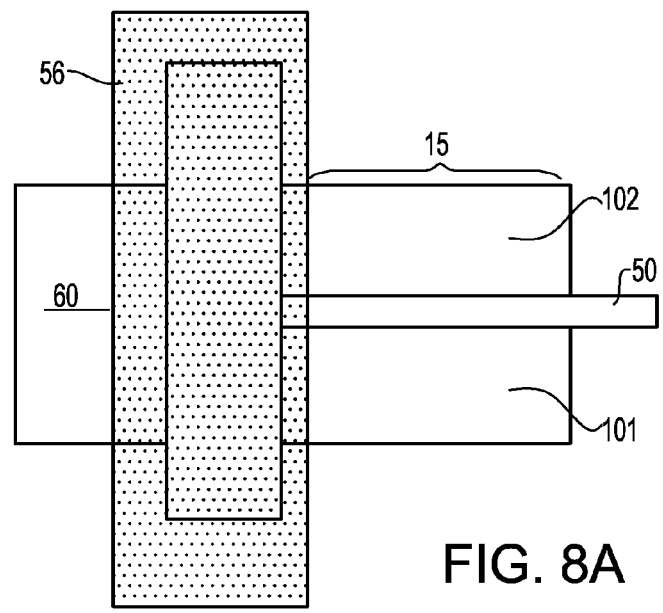
FIG. 8A is a top planar view depicting forming a silicide body contact, in accordance with the present invention.
Figure 8B:
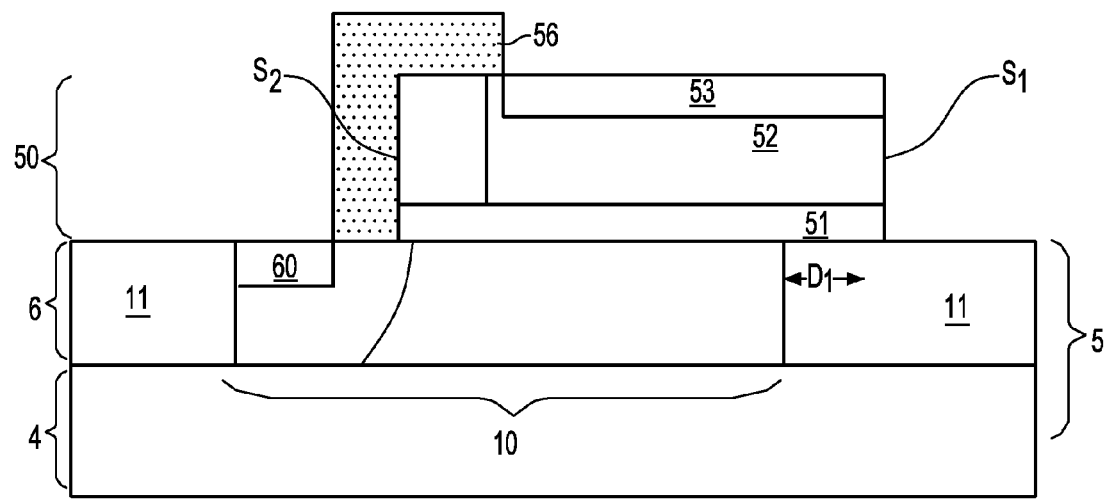
FIG. 8B is a side cross-sectional view of the structure depicted in FIG. 8A along section line A-A, in accordance with the present invention.

FIGS. 8A and 8B depict forming a silicide body contact 60 atop the upper surface of the semiconductor body 10 that is adjacent the remaining portion 56 of the dielectric layer that is abutting the sidewall $S_2$ of the gate structure 50, and forming a silicide gate contact 53 atop the exposed portion of the gate conductor 52 that is adjacent the remaining portion of the dielectric layer 55 that is overlying the upper surface of the gate conductor 52. The silicide that provides the silicide body contact 60 and the silicide gate contact 52 may be positioned on the upper surface of the semiconductor body 10 and the gate conductor 52 that is not covered by the remaining portion 56 of the dielectric layer 55. Silicide formation typically includes depositing a metal layer, such as a refractory metal, onto the surface of a Si-containing material. The metal layer may be deposited using physical vapor deposition (PVD), such as plating or sputtering or may be deposited using chemical vapor deposition (CVD). The metal layer may be composed of Ni, Ti, Co, Mo, Pt, Ta, W or a combination thereof. Following deposition, the structure is then subjected to an annealing step using conventional processes such as, but not limited to, rapid thermal annealing. During thermal annealing, the deposited metal reacts with Si forming a metal semiconductor alloy, which is also referred to as a metal silicide. In one embodiment, the silicide, i.e., silicide body contact 60 and the silicide gate contact 53, are composed $NiSi_2$, $TiSi_2$, $CoSi_2$, $MoSi_2$, $PtSi_2$, $TaSi_2$, WSi or a combination thereof.

Figure 9A:
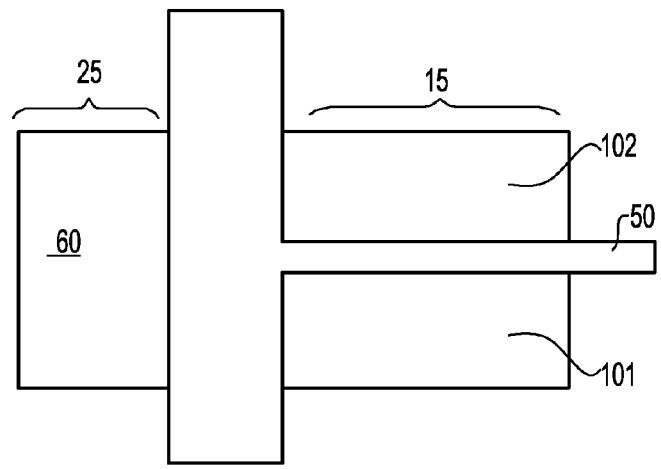
FIG. 9A is a top planar view depicting etching the hard mask, in accordance with the present invention.
Figure 9B:
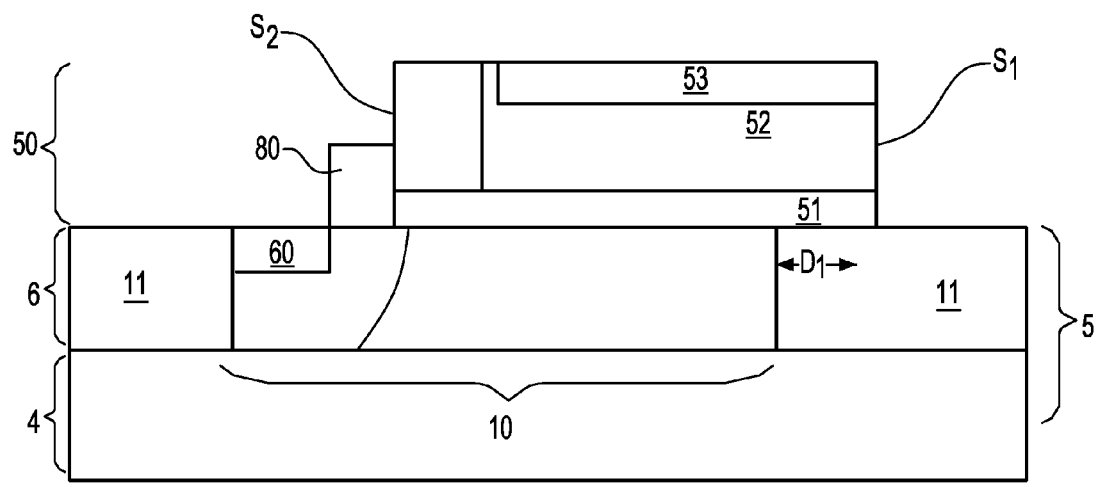
FIG. 9B is a side cross-sectional view of the structure depicted in FIG. 9A along section line A-A, in accordance with the present invention.

FIGS. 9A and 9B depict recessing the remaining portion 56 of the dielectric layer that is positioned on the sidewall $S_2$ of the gate structure 50. The remaining portion 56 can recessed until the remaining portion 56 of the dielectric layer is removed from the upper surface of the gate structure 50 that is adjacent to the silicide gate contact 53. The remaining portion 56 of the dielectric layer 55 may be recessed using a selective etch process. The remaining portion 56 of the dielectric layer 55 is recessed with an etch chemistry that removes the material of the dielectric layer 55 selective to the gate conductor 52, the silicide gate conductor 53, and the silicide body contact 60. In one embodiment, the remaining portion 56 of the dielectric layer 55 is recessed to a height ranging from about 2 nm to about 20 nm. The recessed remaining portion 56 of the dielectric layer is hereafter referred to as a dielectric spacer 80.

In a following process step, an anisotropic etch step removes the portion of the gate conductor 52 that is not underlying the silicide gate contact 53, wherein the anisotropic etch step may include reactive ion etch. The anisotropic etch step may include a selective etch chemistry that removes the gate conductor 52 without substantially etching the silicide gate contact 53, the silicide body contact 60, or the dielectric spacer 80. In one embodiment, in which the silicide body contact 60 is composed of $NiSi_2$, the silicide gate contact 53 is composed of $NiSi_2$, the dielectric spacer 53 is composed of silicon nitride, and the gate conductor 52 is composed of polysilicon, the anisotropic etch includes an etch chemistry composed of $CF_3$, $CH_4$, and/or $NF_3$. The anisotropic etch step may expose a portion of the gate dielectric 51, as depicted in FIGS. 2A and 2B.

At this point, BEOL (back-end-of-the-line) processes may be performed to provide on the final structure shown in FIGS. 1A-2B. For example, a layer of insulating material such as BPSG (boron doped phosphorus silicate glass) can be formed over the structure by deposition and planarization. Contact openings can be formed into the insulating layer by lithography and etching and thereafter the contact holes can be filled with a conductive material, such as, for example, Cu, Al, W, polysilicon and other like conductive materials.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed:

1. A semiconductor device comprising:
   a substrate including a semiconducting layer positioned overlying an insulating layer, the semiconducting layer including a semiconducting body having a first portion and a second portion, wherein a planarization process is performed on the substrate and wherein a densification process is performed on the substrate;
   isolation regions present about a perimeter of the semiconducting body;
   a gate structure overlying an upper surface of the first portion of the semiconducting body;
   a dielectric spacer abutting the gate structure and atop the semiconducting body, wherein a portion of the semiconducting body is exposed; and
   a silicide body contact that is in direct physical contact with the second portion of the semiconducting body that is separated from the first portion of the semiconducting body by a non-silicide semiconducting region,
   wherein:
   a portion of the upper surface of the semiconducting body between the gate structure and the silicide is exposed in that it is not covered by the dielectric spacer,
   a portion of the upper surface of the semiconductor body has a non-silicide semiconducting region doped with a p-type dopant; and
   a bottom surface of the dielectric spacer, a top surface of the isolation regions and a top surface of the silicide are all coplanar to each other.

2. The semiconductor device of claim 1, wherein the substrate comprises a semiconductor-on-insulator substrate.

3. The semiconductor device of claim 1, wherein the gate structure that is present on the first portion of the semiconducting body comprises a gate dielectric located on said upper surface of the first portion of the semiconducting body, a gate conductor present overlying the gate dielectric, wherein a dielectric spacer is present abutting a sidewall of the gate structure opposite a portion of the gate structure that is in closest proximity to the silicide body contact.

4. The semiconductor device of claim 1, wherein the non-silicide semiconducting region that separates the first portion of the semiconducting body from the second portion of the semiconducting body is a p-type semiconductor region.

5. The semiconductor device of claim 1, wherein the silicide body contact comprises $NiSi_2$, $TiSi_2$, $CoSi_2$, $MoSi_2$, $PtSi_2$, $TaSi_2$, WSi or a combination thereof.

6. The semiconductor device of claim 1, wherein the gate structure includes a portion that extends to overlay an isolation region that is opposite a portion of the gate structure that is in closest proximity to the silicide body contact.

7. The semiconductor device of claim 6, wherein the portion of the gate structure that overlies the isolation region comprises a substantially vertical sidewall, the substantially vertical sidewall including a sidewall of the gate dielectric being aligned to a sidewall of the gate conductor.

8. The semiconductor device of claim 7, wherein the gate dielectric has a first width and the gate conductor has a second width, the first width being greater than the second width.

9. The semiconductor device of claim 1, wherein a dielectric spacer is present atop the non-silicide semiconducting region.

10. A method of forming a semiconductor device comprising:
    providing a substrate comprising a semiconducting layer positioned overlying an insulating layer, the semiconducting layer comprising a semiconducting body and isolation regions present about a perimeter of the semiconducting body;
    performing a planarization process on the substrate;
    forming a gate structure overlying a portion of the semiconducting body;
    forming dielectric spacer abutting the gate structure and atop the semiconducting body, wherein a remaining portion of the semiconducting body is exposed;
    forming a silicide on the remaining portion of the semiconducting body; and
    removing a portion of the dielectric spacer that is adjacent to the silicide to expose a portion of the upper surface of the semiconducting body between the gate structure and the silicide; and
    processing a portion of the upper surface of the semiconductor body to provide a non-silicide semiconducting region wherein the non-silicide semiconducting region is doped with a p-type dopant.

11. The method of claim 10, wherein the forming a silicide on the remaining portion of the semiconductor layer includes depositing a metal layer atop the remaining portion of the semiconductor layer; and annealing to form a metal semiconductor alloy.

12. The method of claim 11, wherein the metal layer comprises Ni, Ti, Co, Mo, Pt, Ta, W or a combination thereof.

13. The method of claim 10, wherein the step of removing the portion of the dielectric spacer that is adjacent the silicide to expose the upper surface of the semiconductor body between the gate structure and the silicide comprises:
    forming a photoresist mask overlying the gate structure and exposing the portion of the dielectric spacer to be removed to expose the upper surface for the semiconductor body between the gate structure and the silicide;
    etching selective to the photoresist mask; and
    removing the photoresist mask.

14. The method of claim 13, wherein the photoresist mask exposes a portion of the gate structure and the etching selective to the photoresist mask removes an exposed portion of a gate conductor overlying the gate structure.

15. A method of forming a semiconductor device, comprising:
    providing a substrate comprising a semiconducting layer positioned overlying an insulating layer, the semiconducting layer comprising a semiconducting body and isolation regions present about a perimeter of the semiconducting body;
    forming trenches in the substrate and lining the trenches with a liner material prior to filling the trenches with tetraethylorthosilicate;
    performing a planarization process on the substrate;
    performing a densification process on the substrate;
    forming a gate structure overlying a portion of the semiconducting body;
    forming dielectric layer overlying the gate structure and atop a portion of the upper surface of the semiconducting body adjacent to the portion of the upper surface of the semiconducting body underlying the gate structure, wherein a portion of the semiconducting body is exposed;
    removing a portion of the dielectric layer, wherein a remaining portion of the dielectric layer is positioned on a sidewall of the gate structure;
    forming a silicide on the semiconductor body adjacent the remaining portion of the dielectric layer, and a portion of the upper surface of the semiconducting body between the gate structure and the silicide is exposed; and forming a non-silicide semiconducting region wherein the non-silicide semiconducting region is doped with a p-type dopant.

16. The method of claim 15, wherein the step of forming the dielectric layer overlying the gate structure and atop the portion of the upper surface of the semiconducting body adjacent to the portion of the upper surface of the semiconducting body underlying the gate structure includes depositing a nitride layer.

17. The method of claim 15, wherein removing the portion of the dielectric layer comprises forming a photoresist etch mask and etching the portion of the dielectric layer.

18. The method of claim 15, further comprising recessing the remaining portion of the dielectric layer is positioned on the sidewall of the gate structure.

19. The method of claim 18, wherein the gate structure includes a gate dielectric atop the semiconductor body and a gate conductor atop the gate dielectric.

20. The method of claim 19, wherein the recessing of the remaining portion of the dielectric layer further comprises removing a portion of the gate conductor.

* * * * *